United States Patent
Yang et al.

(10) Patent No.: US 6,406,978 B1
(45) Date of Patent: Jun. 18, 2002

(54) METHOD OF REMOVING SILICON CARBIDE

(75) Inventors: Neng-Hui Yang; Ming-Sheng Yang; Chien-Mei Wang, all of Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 39 days.

(21) Appl. No.: 09/715,420

(22) Filed: Nov. 18, 2000

(30) Foreign Application Priority Data

Nov. 3, 2000 (TW) .......................................... 89123186

(51) Int. Cl.$^7$ ............................................. H01L 21/30
(52) U.S. Cl. ...................... 438/458; 438/931; 438/479; 438/970; 438/515; 117/84; 437/100; 156/610; 156/614
(58) Field of Search ................................ 438/458, 931, 438/970, 479, 493, 515; 117/84, 90, 930; 437/100, 103, 108; 427/248.1, 249; 156/610, 612, 613, 614, 600

(56) References Cited

U.S. PATENT DOCUMENTS

| | | | | |
|---|---|---|---|---|
| 4,855,254 A | * | 8/1989 | Eshita et al. | 437/100 |
| 5,362,682 A | * | 11/1994 | Bozler et al. | 437/226 |
| 5,443,649 A | * | 8/1995 | Sibley | 118/728 |
| 5,471,946 A | * | 12/1995 | Scholz et al. | 117/84 |
| 5,604,151 A | * | 2/1997 | Goela et al. | 437/100 |
| 5,853,478 A | * | 12/1998 | Yonchara et al. | 117/89 |
| 5,937,316 A | * | 8/1999 | Inaba et al. | 438/488 |
| 5,981,400 A | * | 11/1999 | Lo | 438/745 |
| 5,994,207 A | * | 11/1999 | Henley et al. | 438/515 |
| 6,045,626 A | * | 4/2000 | Yano et al. | 148/33.4 |
| 6,153,165 A | * | 11/2000 | Tanino | 423/345 |
| 6,184,111 B1 | * | 2/2001 | Henley et al. | 438/514 |
| 6,300,226 B1 | * | 10/2001 | Miyata et al. | 438/488 |

FOREIGN PATENT DOCUMENTS

| | | | | |
|---|---|---|---|---|
| JP | 410050570 A | * | 2/1998 | H01L/21/02 |
| JP | 410097960 A | * | 4/1998 | H01L/21/02 |

* cited by examiner

Primary Examiner—Matthew Smith
Assistant Examiner—Renzo N. Rocchegiani
(74) Attorney, Agent, or Firm—Charles C.H. Wu; WU & cheung, LLP

(57) ABSTRACT

A method of removing silicon carbide. A silicon wafer is used as a dummy wafer for inspecting the properties of a silicon carbide thin film which is to be formed thereover. A silicon nitride layer with a thickness larger than about 1000 angstroms is formed on the dummy wafer as a base layer of the silicon carbid thin film. The silicon carbide thin film is then formed on the base layer. The property inspection of the silicon carbide thin film is performed. After the properties inspection, the silicon carbide is stripped using a high density hydrogen plasma. After the step of high density hydrogen plasma, if the remaining silicon nitride layer is thicker than about 500 angstroms, the remaining silicon nitride layer can be used as the base layer again for forming and inspecting the properties of the silicon carbide thin film. In contrast, if the remaining silicon nitride layer is thinner than about 500 angstroms, a acid solution is used to dip and remove the remaining silicon nitride layer, and the silicon wafer can then be recycled.

20 Claims, 1 Drawing Sheet

METHOD OF REMOVING SILICON CARBIDE

CROSS-REFERENCE TO RELATED APPLICATION

This application claims the priority benefit of Taiwan application serial no. 89123186, filed Nov. 3, 2000.

BACKGROUND OF THE INVENTION

1. Field of the Invention

The invention relates in general to a method of forming silicon carbide. More particularly, this invention relates to a method of properly stripping the silicon carbide formed over a silicon wafer used as a dummy wafer to inspect the properties of the silicon carbide, so that the silicon wafer can be recycled without performing additional processes such as polishing and re-growth.

2. Description of the Related Art

In a conventional integrated circuit, a dielectric layer with a high dielectric constant (referred as a high k dielectric layer hereinafter) such as silicon nitride with k=7.0 is often used as a barrier layer for preventing diffusion between copper (Cu) and low k dielectric layers while forming copper line. Alternatively, this kind of dielectric layer is also frequently applied as a stop layer for the low k dielectric layer. However, the high k dielectric layer causes a high RC delay since it induces a high parasitic capacitance. As the integrated circuit becomes more and more condense and the process line width thereof shrinks, the RC delay affects the device performance more and more seriously.

To solve the above problem, the silicon carbide material with a lower dielectric constant (k<5) is used. Before the practical application, a silicon carbide layer is formed on a silicon wafer which is used as a dummy wafer. After the property inspection of such silicon carbide layer, it is expected that the silicon carbide can be stripped and the silicon wafer can be recycled. However, due to the hydrophobia of the silicon carbide surface, the wetting effect of acid or alkaline solution is too poor to strip the silicon carbide from the silicon wafer. Moreover, the chemical bonding of high carbon content of silicon carbide makes it even more difficult for removal. Therefore, after property inspection, the whole silicon wafer has to be polished in the supplying manufacture for recycle. Otherwise, the silicon wafer used as the dummy wafer has to be abandoned.

If the silicon carbide is formed on a base layer of silicon oxide or silicon nitride, the silicon carbide can be stripped using acid solution to remove the base layer. However, this kind of process cannot be continuously operated. In addition, the stripped silicon carbide is easily to block the filter of such acid solution to damage the acid circulation of the machine. If one uses dry etch to strip the silicon carbide, it is easily to cause carbon containing polymer adhered on the silicon wafer. In this case, an additional treatment is required to complicate the stripping process, so that the recycle cost is increased.

SUMMARY OF THE INVENTION

The invention provides a method of removing silicon carbide. A silicon wafer is used as a dummy wafer for inspecting the properties of a silicon carbide thin film which is to be formed thereover. A silicon nitride layer with a thickness larger than about 1000 angstroms is formed on the dummy wafer as a base layer of the silicon carbide thin film. The silicon carbide thin film is then formed on the base layer. The property inspection of the silicon carbide thin film is performed. After the properties inspection, the silicon carbide is stripped using a high density hydrogen plasma. After the step of high density hydrogen plasma, if the remaining silicon nitride layer is thicker than about 500 angstroms, the remaining silicon nitride layer can be used as the base layer again for forming and inspecting the properties of the silicon carbide thin film. In contrast, if the remaining silicon nitride layer is thinner than about 500 angstroms, an acid solution is used to dip and remove the remaining silicon nitride layer, and the silicon wafer can then be recycled.

In the above method, both the silicon nitride layer and the silicon carbide thin film are preferably formed by plasma enhanced chemical vapor deposition (PECVD). The content of the silicon carbide preferably includes 20–35% of carbon atoms, 20–40% of silicon atom, 20–50% of hydrogen atoms and 0–10% of nitrogen atoms. The condition for the high density hydrogen plasma preferably includes a temperature of about 350–450° C. in the reaction chamber, a pressure of about 4–8 mTorr, a hydrogen flow rate of about 300–800 sccm and a low frequency RF power of about 3000–4000 W at about 1 MHz. The duration for the high density hydrogen plasma is about 1–3 minutes plus the time for forming the silicon carbide thin film.

In the method mentioned above, the silicon wafer or the base layer and the silicon wafer can be recycled without causing the problems occurring in the conventional method. The fabrication cost can thus be greatly reduced.

Both the foregoing general description and the following detailed description are exemplary and explanatory only and are not restrictive of the invention, as claimed.

DESCRIPTION OF THE PREFERRED EMBODIMENTS

Figure 1:
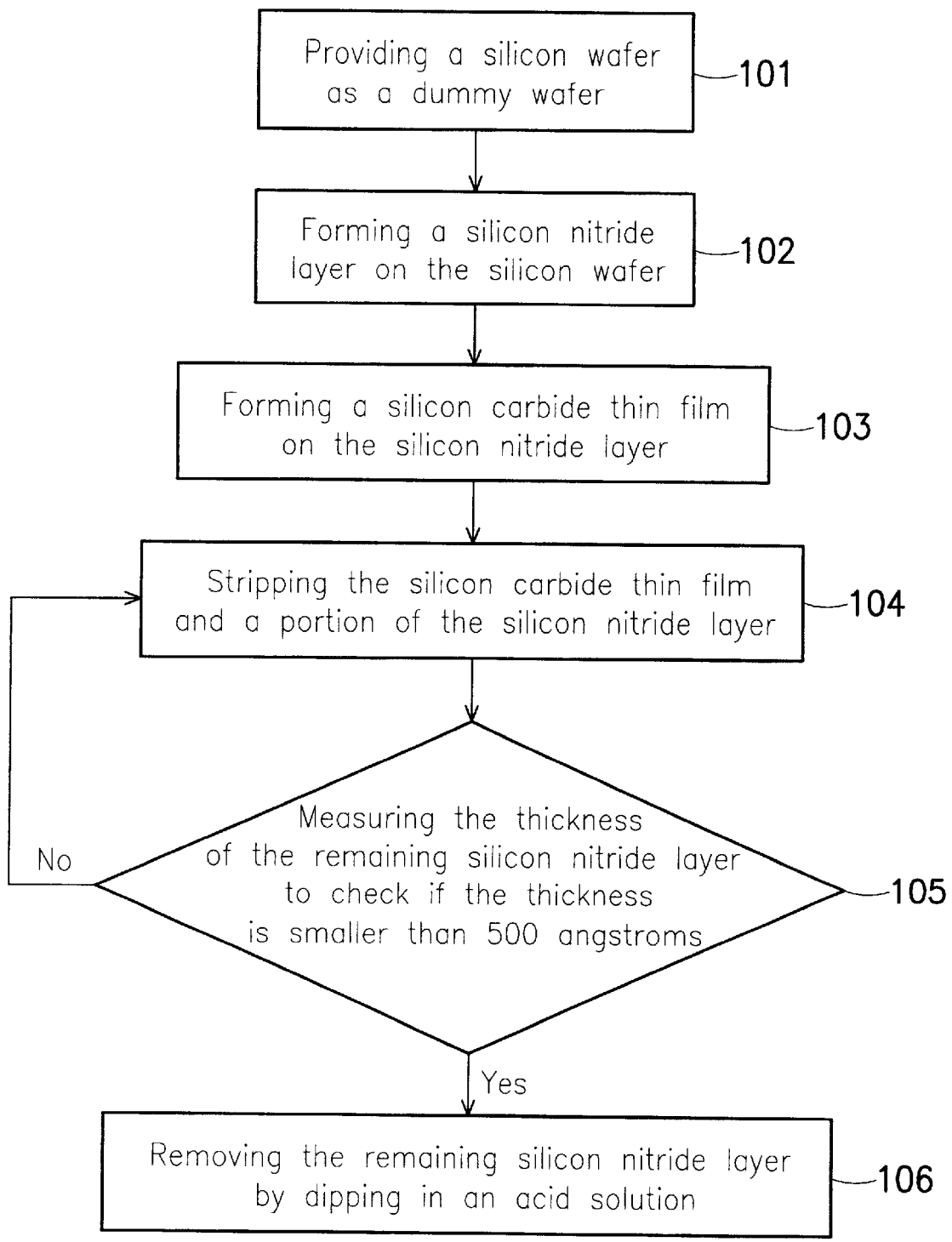
FIG. 1 is a flow chart of the method for removing silicon carbide according to the invention.

Referring to FIG. 1, an embodiment which provides a method of removing silicon carbide is shown. In step 101, a semiconductor substrate, for example, a silicon wafer is provided as a dummy wafer for inspecting properties of a silicon carbide thin film to be formed. In step 102, a silicon nitride layer is formed on the silicon wafer as a base layer by plasma enhanced chemical vapor deposition, for example. Preferably, the silicon nitride layer is formed with a thickness larger than about 1000 angstroms.

In step 103, a silicon carbide thin film is formed on the silicon nitride layer. Preferably, the content of the silicon carbide thin film comprises about 20–35% of carbon atoms, 20–40% of silicon atoms, 20–50% of hydrogen atoms and 0–10% of nitrogen atoms. The formation method of the silicon carbide thin film includes plasma enhanced chemical vapor deposition, for example. After the silicon carbide thin film is formed, properties such as refractive index, thickness, uniformity can be inspected.

In step 104, a high density hydrogen plasma treatment is performed to strip the silicon carbide thin film. The condition of such high density hydrogen plasma treatment is performed at a chamber temperature of about 350–450° C., a pressure of about 4–8 mTorr, a hydrogen flow rate of about 300–800 sccm, a low frequency RF power of about 3000–4000 W at about 1 MHz. The duration of such treatment is the time for forming the silicon carbide thin film plus 1 to 3 minutes. Thus, the silicon carbide can be effectively removed.

In the high density hydrogen plasma treatment, in addition to strip the silicon carbide thin film, the base layer, that is, a portion of the silicon nitride layer may be consequently removed. Therefore, after the silicon carbide thin film is removed, the thickness of the remaining silicon nitride layer is measured in step 105. When the thickness of the remaining silicon nitride layer is larger than about 500 angstroms, the silicon nitride layer can again used as the base layer for forming another silicon carbide thin film for further inspection. That is, in step 105, whether the thickness of the remaining silicon nitride layer is larger than about 500 angstroms is measured. When the remaining silicon nitride layer is thicker than about 500 angstrom, the process goes back to step 104 for directly forming a silicon carbide layer for further inspection. In contrast, if the remaining silicon nitride layer is thinner than about 500 angstroms, it can be removed via dipping in an acid solution such as 49% HF in step 106. After removing the silicon nitride layer, the silicon wafer can be recycled and reused without any additional process. The silicon wafer is thus ready for recycled to go through steps 102 to 106 again.

Table 1 shows the relative properties for a silicon carbide thin film formed on the silicon nitride layers with thickness of about 3000 angstroms and 7000 angstroms, respectively.

TABLE

| Thickness (Å) | Thickness Uniformity (%) | Refractive Index | Uniformity of Refractive Index (%) | Stress (dynes/cm²) |
|---|---|---|---|---|
| 3008 | 0.53 | 2.0065 | 0.4 | −1.5E+09 |
| 6987 | 0.52 | 2.0063 | 0.38 | −1.52E+09 |

Table 2 shows the relative properties of a silicon carbide thin film with a thickness of about 700 angstroms formed on a 3000 angstroms thick silicon nitride layer, a 7000 angstroms thick silicon nitride layer and a silicon wafer.

TABLE 2

| Base layer (Å) | Thickness (Å) | Thickness Uniformity (Å) | Refractive Index | Uniformity of Refractive Index (%) |
|---|---|---|---|---|
| SiN (3000) | 707 | 2.4 | 1.853 | 0.14 |
| SiN (7000) | 705 | 2.4 | 1.852 | 0.15 |
| Silicon Wafer | 701 | 2.1 | 1.853 | 0.13 |

It can be seen from Table 2 that the properties of silicon carbide do not vary according to the difference of the base layer. Therefore, in the invention, to form the silicon carbide on a silicon nitride layer has no difference from forming the silicon carbide on a silicon wafer directly.

Table 3 shows an example of the content of the silicon carbide thin film, and Table 4 shows an example of the operation parameters for the high density hydrogen plasma treatment.

TABLE 3

| Element | Silicon | Carbon | Hydrogen | Nitrogen |
|---|---|---|---|---|
| Atom Percentage (%) | 25 | 26 | 41 | 8 |

TABLE 4

| Temperature (° C.) | Pressure (mTorr) | Hydrogen Flow Rage (sccm) | RF Power (W) | Time (Seconds) |
|---|---|---|---|---|
| 425 | 4.6 | 450 | 3500 | 240 |

Table 5 shows that the properties of the silicon nitride layer after stripping the silicon carbide thin film. It is clearly from Table 4 that, apart from the thickness, the properties of the remaining silicon nitride layer do not vary according to the removal of the silicon carbide.

TABLE 5

| Base Layer (Å) | Thickness (Å) | Thickness Uniformity (%) | Refractive Index | Uniformity of Refractive Index (%) |
|---|---|---|---|---|
| SiN (3000) | 2804 | 0.54 | 2.0058 | 0.4 |
| SiN (7000) | 6777 | 0.52 | 2.0049 | 0.34 |

Table 6 shows etching rate of the high density hydrogen plasma for different deposition layers. It can been seen that the etching rate for the silicon carbide is three times of that of the silicon nitride. Therefore, there is no worry that the silicon nitride layer will be over etched while removing the silicon carbide.

TABLE 6

| Thin Film | PECVD SiC | PECVD SiN | PECVD SiO |
|---|---|---|---|
| Etching Rate (Å/min) | 321 | 113 | 150 |

Therefore, the invention provides a method for effectively stripping a silicon carbide layer without causing problems as described in the prior art. By this method, the silicon wafers can be recycled or reused without any additional processes or cost.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of removing silicon carbide, wherein a silicon nitride layer and a silicon carbide thin film are sequentially formed on a semiconductor substrate, the method comprising:

performing a high density hydrogen plasma treatment on the silicon carbide thin film until the remaining silicon nitride layer has a thickness larger than about 500 angstroms; and reusing the remaining silicon nitride layer as a base layer for forming another silicon carbide layer.

2. The method according to claim 1, wherein the step of providing a semiconductor comprises a step of providing a silicon wafer.

3. The method according to claim 1, wherein the step of forming a silicon nitride layer comprises a step of forming the silicon nitride layer by plasma enhanced chemical vapor deposition.

4. The method according to claim 1, wherein the step of forming the silicon nitride layer comprises forming the silicon nitride layer with a thickness larger than about 1000 angstrom.

5. The method according to claim 1, wherein the step of forming a silicon carbide layer comprises forming the silicon carbide layer by plasma enhanced chemical vapor deposition.

6. The method according to claim 1, comprising further the step of inspecting properties of the silicon carbide thin film after it is formed.

7. The method according to claim 1, wherein the step of forming a silicon carbide thin film comprises forming the silicon carbide thin film with the content of 20–35% of carbon, 20–40% of silicon, 20–50% of hydrogen and 0–10% of nitrogen.

8. The method according to claim 1, wherein the step of performing a high density hydrogen plasma treatment comprises performing the high density hydrogen treatment for a time required for forming the silicon carbide thin film plus 1 to 3 minutes.

9. The method according to claim 1, wherein the high density hydrogen plasma treatment is performed with the following conditions:
- a chamber temperature of about 350–450° C.;
- a pressure of about 4–8 mTorr;
- a hydrogen flow rate of about 300–800 sccm; and
- a low frequency RF power of about 3000–4000 W at about 1 MHz.

10. A method of preparing a silicon dummy wafer for inspecting properties of silicon carbide, the method comprising:
- providing a semiconductor substrate;
- forming a silicon nitride layer on the semiconductor substrate;
- forming a silicon carbide thin film on the silicon nitride layer;
- performing a high density hydrogen plasma treatment on the silicon carbide thin film until the remaining silicon nitride layer has a thickness less than about 500 angstroms;
- removing the remaining silicon nitride layer using an acid solution; and
- recycling and reusing the silicon wafer.

11. The method according to claim 10, wherein the step of providing a semiconductor comprises a step of providing a silicon wafer.

12. The method according to claim 10, wherein the step of forming a silicon nitride layer comprises a step of forming the silicon nitride layer by plasma enhanced chemical vapor deposition.

13. The method according to claim 10, wherein the step of forming the silicon nitride layer comprises forming the silicon nitride layer with a thickness larger than about 1000 angstrom.

14. The method according to claim 10, wherein the step of forming a silicon carbide layer comprises forming the silicon carbide layer by plasma enhanced chemical vapor deposition.

15. The method according to claim 10, comprising further the step of inspecting properties of the silicon carbide thin film after it is formed.

16. The method according to claim 10, wherein the step of forming a silicon carbide thin film comprises forming the silicon carbide thin film with the content of 20–35% of carbon, 20–40% of silicon, 20–50% of hydrogen and 0–10% of nitrogen.

17. The method according to claim 10, wherein the step of performing a high density hydrogen plasma treatment comprises performing the high density hydrogen treatment for a time required for forming the silicon carbide thin film plus 1 to 3 minutes.

18. The method according to claim 10, wherein the high density hydrogen plasma treatment is performed with the following conditions:
- a chamber temperature of about 350–450° C.;
- a pressure of about 4–8 mTorr;
- a hydrogen flow rate of about 300–800 sccm; and
- a low frequency RF power of about 3000–4000 W at about 1 MHz.

19. The method according to claim 10, wherein the step of removing the remaining silicon nitride layer comprises removing the silicon nitride layer using 49% HF.

20. A method for recycling a silicon wafer, comprising:
a) providing a silicon wafer as a dummy wafer;
b) forming a silicon nitride layer with a thickness larger than about 1000 angstroms on the dummy wafer as a base layer;
c) forming a silicon carbide thin film on the base layer for inspecting properties thereof;
d) removing the silicon carbide thin film using high density hydrogen plasma;
e) repeating the steps of c) to d) if the remaining silicon nitride layer is larger than about 500 angstroms; and
f) removing the silicon nitride layer using acid solution if the remaining silicon nitride layer is smaller than about 500 angstroms, and recycling the silicon wafer.

* * * * *